(12) United States Patent
Okojie

(10) Patent No.: US 6,426,296 B1
(45) Date of Patent: Jul. 30, 2002

(54) METHOD AND APPARATUS FOR OBTAINING A PRECISION THICKNESS IN SEMICONDUCTOR AND OTHER WAFERS

(75) Inventor: Robert S. Okojie, Strongsville, OH (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 86 days.

(21) Appl. No.: 09/657,744

(22) Filed: Sep. 8, 2000

(51) Int. Cl.$^7$ ................................................ H01L 21/00
(52) U.S. Cl. ..................... 438/692; 156/345; 216/2; 216/38; 216/84; 216/88; 438/8; 438/745
(58) Field of Search ..................... 438/8, 9, 16, 691, 438/692, 745, 753, 756; 216/2, 38, 84, 85, 88, 89, 99; 156/345, 345 LP, 345 LC

(56) References Cited

U.S. PATENT DOCUMENTS

| | | |
|---|---|---|
| 4,793,895 A | 12/1988 | Kaanta |
| 5,242,524 A | 9/1993 | Leach |
| 5,433,651 A | 7/1995 | Lustig |
| 5,667,629 A | 9/1997 | Pan |
| 5,777,739 A | 7/1998 | Sandhu |
| 6,015,754 A | 1/2000 | Mase |

*Primary Examiner*—William A. Powell
(74) *Attorney, Agent, or Firm*—Kent N. Stone

(57) ABSTRACT

A method and apparatus for processing a wafer comprising a material selected from an electrical semiconducting material and an electrical insulating material. The wafer has opposed generally planar front and rear sides and a peripheral edge, wherein said wafer is pressed against a pad in the presence of a slurry to reduce its thickness. The thickness of the wafer is controlled by first forming a recess such as a dimple on the rear side of the wafer. A first electrical conducting strip extends from a first electrical connection means to the base surface of the recess to the second electrical connector. The first electrical conducting strip overlies the base surface of the recess. There is also a second electrical conductor with an electrical potential source between the first electrical connector and the second electrical connector to form. In combination with the first electrical conducting strip, the second electrical conductor forms a closed electrical circuit, and an electrical current flows through the closed electrical circuit. From the front side of the wafer the initial thickness of the wafer is reduced by lapping until the base surface of the recess is reached. The conductive strip is at least partially removed from the base surface to automatically stop the lapping procedure and thereby achieve the desired thickness.

27 Claims, 3 Drawing Sheets

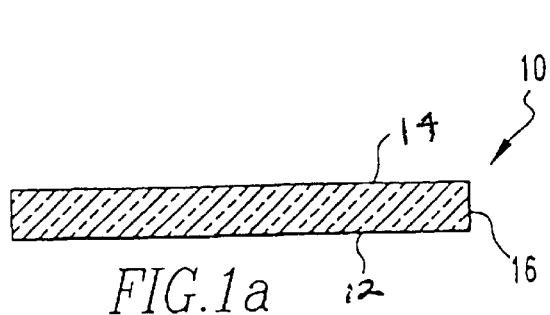
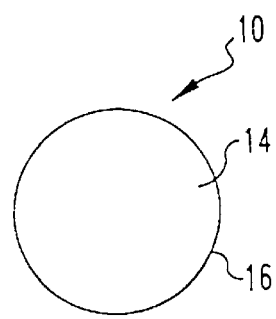
FIG.1a   FIG.1b
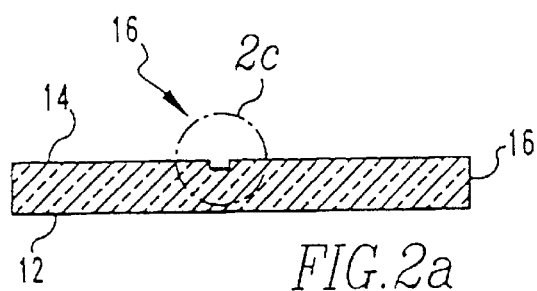
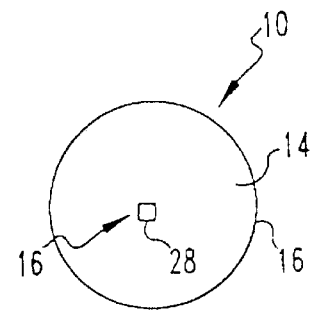
FIG.2a   FIG.2b
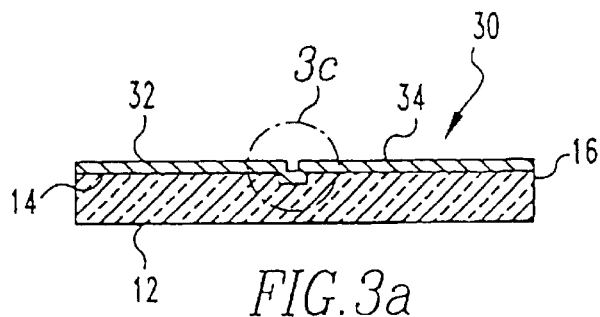
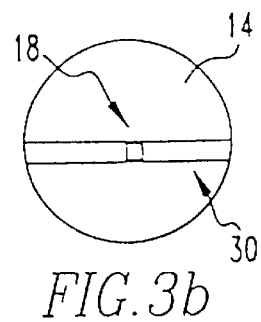
FIG.3a   FIG.3b

METHOD AND APPARATUS FOR OBTAINING A PRECISION THICKNESS IN SEMICONDUCTOR AND OTHER WAFERS

ORIGIN OF THE INVENTION

The invention described herein was made by an employee of the U.S. Government and may be manufactured and used by or for the U.S. Government for governmental purposes without the payment of any royalties thereon or therefor.

BACKGROUND OF THE INVENTION

1. Technical Field

The present invention relates to an end-point detector and a method for quickly and accurately measuring a change in thickness in semiconductor and other wafers during chemical-mechanical polishing (CMP) of the wafer.

2. Background Information

The prior art discloses methods and apparatus for removing material by chemical-mechanical polishing (CMP) from the surface of a wafer in the production of ultra-high density integrated circuits. In a typical process, a wafer is pressed against a polishing pad in the presence of a slurry under controlled chemical, pressure, velocity, and temperature conditions. The slurry solution generally contains small, abrasive particles that abrade the surface of the wafer and chemicals that etch and/or oxidize the surface of the wafer. The polishing pad is generally a planar pad made from a porous material such as blown polyurethane. Thus, when the pad and/or the wafer moves with respect to the other, material is removed from the surface of the wafer by the abrasive particles (mechanical removal) and by the chemicals in the slurry (chemical removal).

Microsensor technology is heavily dependent on precision wafer thickness control during fabrication. Poor thickness control has resulted in deviation in predicted system functionality. Inconsistent reproducibility of sensor functionality has also been partially attributed to the lack of precision control of wafer thickness. The existence and seriousness of the problem has remained a major area of research.

The prior art discloses various methods and apparatus for obtaining a wafer of a desired thickness at the completion of the process. U.S. Pat. No. 4,793,895 to Kaanta, et al., for example, discloses an apparatus and method for monitoring the conductivity of a semiconductor wafer during the course of a polishing process. A polishing pad that contacts the wafer has an active electrode and at least one passive electrode, both of which are embedded in the polishing pad. A detecting device is connected to the active and passive electrodes as the wafer is lapped by the polishing pad. The etch end-point of the wafer is determined as a function of the magnitude of the current flow.

U.S. Pat. No. 5,242,524 to Leach, et al. discloses an apparatus for remotely detecting impedance adapted for use on a polishing machine wherein the end point of polishing for removing a surface layer during the processing of semiconductor substrates is detected. A first stationary coil having a high permeability core is wound having an air gap and an AC voltage is applied to the stationary coil to provide a magnetic flux in the air gap. A second coil is mounted for rotation on the polishing table, in a position to periodically pass through the air gap of the stationary coil as the table rotates. The second coil is connected at its opposite ends to contacts which are embedded in the surface of the polishing wheel. The contacts are positioned to engage the surface of the substrate being polished and provide a load on the second rotating coil when it is in the air gap of the stationary coil, will perturb the flux field therein as a function of the resistance of the load caused by the contacts contacting either a conducting surface or a non-conducting surface. This perturbance of the flux field is measured as a change in the induced voltage in the stationary cell which is converted to a signal processed to indicate the end point of polishing, the end point being when a metallic layer has been removed to expose a dielectric layer or when a dielectric layer has been removed to expose a metallic layer.

U.S. Pat. No. 5,433,651 to Lustig, et al. discloses an in-situ chemical mechanical polishing (CMP) process monitor apparatus for monitoring a polishing process during polishing of a workpiece in a polishing machine, the polishing machine having a rotatable polishing table provided with a polishing slurry, is disclosed. The apparatus comprises a window embedded within the polishing table, whereby the window traverses a viewing path during polishing and further enables in-situ viewing of a polishing surface of the workpiece from an underside of the polishing table during polishing as the window traverses a detection region along the viewing path. A reflectance measurement means is coupled to the window on the underside of the polishing table for measuring a reflectance measurement means providing a reflectance signal representative of an in-situ reflectance, wherein a prescribed change in the in-situ reflectance corresponds to a prescribed condition of the polishing process.

U.S. Pat. No. 5,667,629 to Pan, et al. discloses an apparatus and method for determination of the end-point for chemical-mechanical polishing of a layer of dielectric material formed on an integrated circuit wafer. A first voltage is generated which is proportional to the current supplying electrical power to the electric motor driving the polishing mechanism. The current is proportional to the rate of removal of dielectric material by the polishing process. The integral over time of the first voltage, which is proportional to the amount of dielectric material and is a function of the age of the polishing pad. When the integral over time of the first voltage is less than the reference voltage the polishing continues. When the integral over time of the first voltage is equal to the reference voltage or becomes larger than the reference voltage the polishing is stopped.

U.S. Pat. No. 5,777,739 to Sandhu, et al. discloses an end-point detector and a method for quickly and accurately measuring the change in thickness of a wafer in chemical-mechanical polishing processes. The end-point detector has a reference platform, a measuring face, and a distance measuring device. The reference platform is positioned proximate to the wafer carrier, and the reference platform and measuring device are positioned apart form one another by a known, constant distance. The measuring face is fixedly positioned with respect to the wafer carrier at a location that allows the measuring device engage the measuring face when the wafer is positioned on the reference platform. Each time the measuring device engages the measuring face with respect to the measuring device. The displacement of the measuring face is proportional to the change in thickness of the wafer between measurements.

U.S. Pat. No. 6,015,754 to Mase, et al. discloses an apparatus used to subject a target surface of a semiconductor wafer to a polishing treatment, by moving the target surface and a polishing surface of a polishing cloth relative to each other while supplying a polishing cloth relative to each other while supplying a polishing liquid between the target surface and the polishing surface. Electric resistance is measured between pairs of measuring points arranged on opposite sides of dicing lines on the target surface, while subjecting the target surface to the polishing treatment. The polishing treatment is caused to be ended by comparing detected values of a changing rate in measured values of the electric property with a reference value set to correspond to an end point of the polishing treatment.

Such prior art of thickness control during lapping and polishing involves intermittent stopping of the lapping process to measure the thickness by various means. Other methods include capacitive sensing, slurring monitoring, and optical measurement. In the case of reactive ion etching, end-point detection using optical emission spectroscopy has been employed as a method.

The main disadvantages of the prior art include the time wasted during intermittent lapping and stopping, lack precision of measurement, involve considerable measurement complexity and have attendant high costs.

SUMMARY OF THE INVENTION

It is an objective of this invention to provide a precision thickness capability during lapping and polishing of semiconductor wafers and other wafers such as dielectric wafers.

It is a further objective of the present invention to provide automatic control features in the lapping and polishing of semiconductor wafers and other such wafers.

It is a further objective of the present invention to provide a means for end-point detection during chemical etching in the production of semiconductor wafers and other such wafers.

It is a further objective of the present invention to provide a method and apparatus for producing very thin diaphragms or other such structures.

It is a further objective of the present invention to provide a simple and low cost means for producing semiconductor wafers and other such wafers, and in particular, to achieve a desired thickness in such wafers.

It is a further objective of the present invention to improve the ease of operation of equipment used in the manufacture of semiconductor wafers and other such wafers.

It is a still further objective of the present invention to provide a means for using multiple fuses across the wafer so as to capture distributed non-uniformities.

The method and apparatus of the present invention makes use of a fused etch-stop as a basis of lapping and polishing of wafers to predetermined thickness and improved precision. It will make it possible to lap and polish wafers down to thickness lesser than currently achieved, with minimal error, which will be governed by the thickness uniformity of the lapped wafer. As a result, it becomes possible to fabricate unique devices on the thin-film wafer, which is usually not practical. It will also make it possible to precisely detect the depth of a desired trench depth.

Recent advances in the process technology of semiconductors of dissimilar materials have made it possible to utilize the benefits of chemical-mechanical polishing (CMP), wafer bonding, and reactive ion etching to leverage development of novel devices based on heterogeneous integration technology. Thickness control of wafers during lapping and chemical-mechanical polishing and end-point detection during reactive ion etching have remained a major barrier toward harnessing the optimum benefit of heterogeneous integration. Uniform diaphragm thickness, for example, is highly desired in the fabrication of membranes used for pressure sensors. Uniform thickness across the wafer is also desired during the fabrication of special semiconductor materials such as silicon carbide where some special processes are required in order to achieve the desired functionality. End-point detection during deep reactive ion etching has remained a challenge. Polarity-dependent etches require intentional doping to facilitate effective etch-stopping at the junction. However, this method is process intensive and lacks the flexibility of choice of desired thickness.

It has been found to be possible to lap and polish wafers down to thickness less than 5 microns, with very small error percent, which will only be governed by the thickness uniformity of the wafer. As a result, it becomes possible to fabricate unique devices on thin-film wafers, which has not been practical. It will also make it possible to precisely detect the desired depth during reactive ion etching.

The mode of operation of the method of the present invention involves the utilization of two wafers, target wafer and carrier wafer. The target wafer is lapped and polished while the carrier wafer serves as platform on which the target wafer is attached. By the use of photolithography, holes are strategically etched on the back side of the target wafer. The depth of the holes corresponds to the desired final thickness of the thin-film wafer. Thin strips of metal are deposited and patterned to run end to end of the target wafer. In doing so the strips would run directly over the holes maintaining a step coverage. The base width of the dimple can be made very small which may be less than the width of the eventual grids that define the boundary of a die on the wafer. A second wafer, the carrier, is obtained and an electrically insulating material (or the wafer may be insulating) is deposited on one of its face. The face of the first wafer with the holes and conductor strip is brought to intimate contact with the face of the carrier wafer with the bonding material. The diameter of the carrier wafer can be intentionally made slightly smaller than the first wafer so that when the wafers are mated and bonded, the first wafer will extend further out to reveal the conductor strip at the edge of the first wafer. Electrical contact can then be made at the end terminals of the conductor strip. Alternatively, through-holes are etched in the carrier wafer such that portions of the conducting strip are exposed to facilitate external electrical contact.

In the functional operation of the method of this invention, the entire unit is then mounted on the lapping machine with the un-etched face of the target wafer facing down. Connecting wires are run from the strip contact to an oh meter that monitors the resistance between any two terminals of the strip or a multiple of them. The conductor can be made to become part of the electrical system of the equipment so that it functions as a variable resistor. When the lapping process reaches the conductor, the conductor will also be lapped and the resistance will start increasing. When the lapping process eventually breaks the conductor, an open circuit is observed, which signifies that the desired thickness has been achieved and the "fuse" will open. This opening will cause the flapping equipment to stop automatically, thus obtaining the precise thickness. In the case whereby the slurry or polishing wheel is conducting, complete fusing may not be achieved, but the abrupt change in resistivity can be utilized as a control mechanism.

BRIEF DESCRIPTION OF THE DRAWINGS

The preferred embodiment of the invention, illustrative of the best mode in which applicant contemplated applying the principles, is set forth in the following description and is shown in the drawings and is particularly and distinctly pointed out and set forth in the appended claims.

FIG. 1a is a vertical cross section of a semiconductor wafer prior to the application of the method of the present invention;

FIG. 1b is a top plan view of the wafer shown in FIG. 1a illustrating what is referred to as the front side of the wafer;

FIG. 2a is a vertical cross section similar to FIG. 1a after the first step of the method of the present invention has been conducted on the wafer;

FIG. 2b is a top plan view of the processed wafer shown in FIG. 2a which is referred to as the rear side of the wafer;

FIG. 2c is a detailed view of circle 2c in FIG. 2a;

FIG. 3a is a vertical cross sectional view similar to FIG. 1a in which a second step of the preferred embodiment of the method of the present invention is illustrated;

FIG. 3b is a top plan view which is often called a rear side view of the wafer shown in FIG. 3a;

FIG. 3c is a detailed view of circle 3c in FIG. 3a;

FIG. 4b is a top plan view of the assembly shown in FIG. 4a;

DESCRIPTION OF THE PREFERRED EMBODIMENTS

Referring to FIGS. 1a and 1b, a target semiconductor wafer shown generally at numeral 10. This wafer has a front surface 12 and a rear surface 14 with a peripheral edge 16.

Figure 2C:
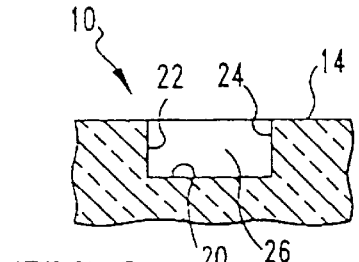

Referring to FIGS. 2a–2c, a recess which is shown as dimple 18 is formed on the rear side 14 of the wafer. This recess is preferably formed by chemical etching as is. This recess has a base surface 20. This base surface 20 is parallel to the rear surface 14 of the wafer 10. Between the rear surface 14 and the base surface 20, there are perpendicular recess walls 22, 24, 26 and 28 which peripherally surround the base surface 20 and perpendicularly connect the rear surface 14 and the base surface 20.

Figure 3C:
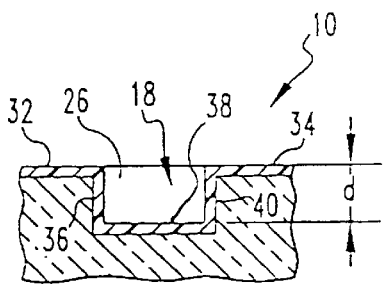

Referring to FIGS. 3a–3c, in the next step of the method, an electrically conductive strip shown generally at numeral 30 is applied to the rear surface 14 of the wafer 10. This electrically conductive strip 30 has opposed major segments 32 and 34 which are positioned directly on the rear surface 14 of the wafer 10. The electrically conductive strip 30 also has a dimple wall segment 36 which is connected to a dimple base surface segment 38. The electrically conductive strip 30 is preferably a metallized surface which is applied by a conventional sputter metallization or vapor deposition metallization process. This conductive strip 30 may alternatively be a conductive polymer coating.

Figure 4A:
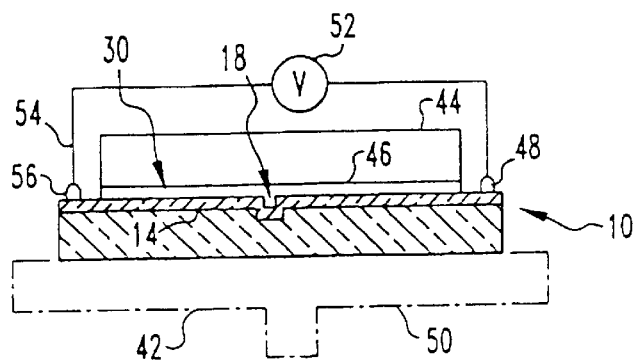
FIG. 4a is a vertical cross sectional view of a wafer similar to FIG. 1a along with associated equipment shown schematically illustrating a third step in the preferred embodiment of the method of the present invention.
Figure 4B:
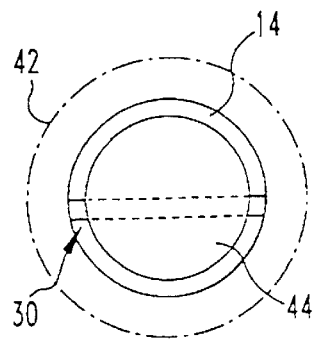
Figure 5:
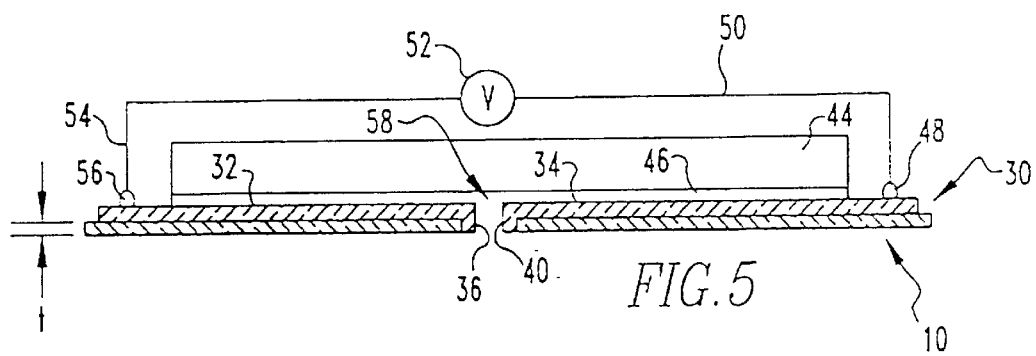
FIG. 5 is a vertical cross sectional view similar to FIG. 1a with associated apparatus shown schematically illustrating a fourth step in the preferred embodiment of the method of the present invention.

Referring to FIGS. 4a and 4b, an assembly by which the wafer 10 shown in FIGS. 3a and 3b may be used to accurately adjust the thickness of the wafer as shown. In this assembly, a holder shown generally at numeral 42 in broken lines is positioned over the target wafer 10. The wafer 10 is superimposed on a carrier substrate 44. A bonding medium 46 is interposed between the target wafer 10 and the carrier substrate 44. A suitable bonding medium 46, is interposed between the carrier substrate 44 and the target wafer 10. On rear surface segment 32 of the electrically conductive strip 30 there is positioned an electrical connector 48 from which conductor 50 extends to electrical potential source 52. Conductor 54 extends from electrical potential source 52 to another electrical connector 56 which is positioned on the rear surface segment 34 of metalized strip 30. The electrical potential source is preferably from about 0.1 mV to 5V. It will be appreciated that at this point in the method of this invention, a closed circuit is established which includes the electrical potential source 52 and the base surface segment 38 of the electrically conductive strip 30. At this point in the method of this invention, the thickness of the target wafer 10 is reduced from the front surface 12 by conventional chemical-mechanical polishing (CMP) processes as, for example, by lapping. The apparatus and method for such conventional chemical-mechanical polishing (CMP) processes is described, for example, in U.S. Pat. No. 5,777,739, particularly at column 1 from lines 13–53. Such reduction of the thickness of the wafer 10 continues until such time as the base surface segment 38 of the electrically conductive strip 30 is reached. The thickness reduction by lapping continues until the base surface 38 has been removed as is shown in FIG. 5. At this point in the method of this invention, it will be understood that the closed circuit shown in FIGS. 4a and 4b will be opened because of the removal of the base circuit 38 from the electrically conductive strip 30. As is shown in FIG. 5, the resulting aperture 58 separates conductive wall segments 36 and 40 of the conductive strip 30. This conversion is conductive base segment 38 to aperture 58 thus acts as a "fuse" to interrupt current flow in the circuit. By conventional means, the cessation of the current flow in this circuit will be sensed and the lapping procedure will be automatically halted as soon as the desired thickness t is reached. It will furthermore be understood that this desired thickness t will be equal to the perpendicular depth d of the dimple 18 below the plane of rear surface 14 as is shown in FIGS. 3c and 5. Alternatively, it would also be possible to only remove some conductive material on the conductive base surface segment 38 so as to cause the lapping to cease when a restriction of current flow is sensed.

Those skilled in the art will also appreciate that it will be possible to use multiple dimples as at dimple 18 on the rear surface 14. Such an arrangement would allow the thickness to be monitored at several transverse locations on the wafer 10.

Those skilled in the art will also appreciate that, in addition to semiconductor wafers, the method and apparatus of the present invention can be adapted to be used in the processing of wafers comprised of dielectrics or other insulative materials.

Figure 6:
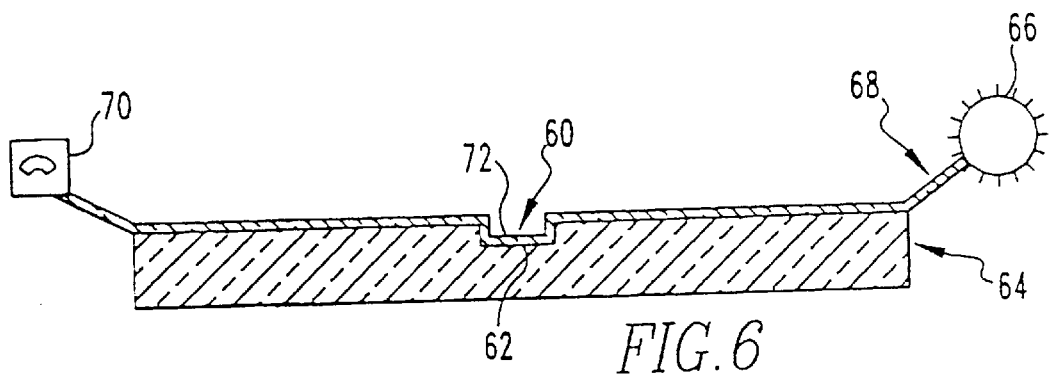
FIG. 6 is a vertical cross sectional view similar to FIG. 1a with associated apparatus shown schematically illustrating an alternate preferred embodiment of the method of the present invention.

It will be understood that it would be possible, within the scope of this invention, to control the reduction of thickness of the wafer by means of a light conducting system as well as an electrical circuit. Referring, for example, to FIG. 6, a recess 60 having a base surface 62 is formed in a wafer 64 as was described above. A light emitting diode (LED) 66, or other suitable light source, is connected by an optical fiber 68 to a meter 70 for measuring light intensity. A segment 72 of the optical fiber 68 is superimposed on the base surface 62 of the recess 60. When the thickness of the wafer 64 is reduced to the point that the base surface 62 of the recess 60 is reached, the amount of light conveyed through the optical fiber 68 will be reduced and then stopped. Further reduction in the thickness of the wafer will automatically be halted when a predetermined reduction or complete cessation of light transmission has been reached.

Figure 7:
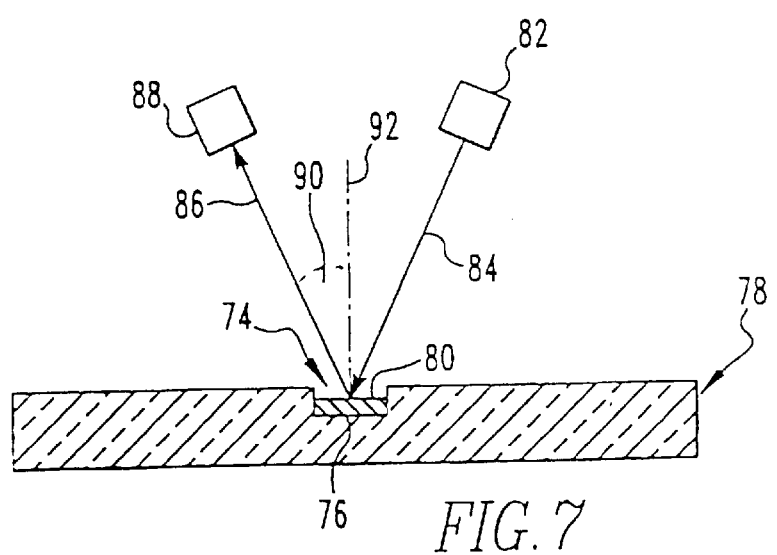
FIG. 7 is a vertical cross sectional view similar to FIG. 1a with associated apparatus illustrating another alternate preferred embodiment of the method of the present invention.

It would also be possible, within the scope of this invention, to control the reduction of thickness of a wafer based on the reflectivity of a material superimposed on the base of the recess. Referring, for example, to FIG. 7, the recess 74 having a base surface 76 is formed in wafer 78 as described above. A reflective metal surface 80 is superimposed on the base surface 76 of the recess 74. A laser 82 or other light source directs light beam or ray 84 at the reflective metal surface 76 to direct reflected light beam 86 to meter 88 which measures light intensity or alternatively changes in the angle of reflection 90 between light beam 86 and a line 92 which is perpendicular to the reflective metal surface 80. It will be understood that changes in the angle of reflection would result from changes in the thickness of the reflective metal surface since reflection would take place at different phases on the wave of the light beam being reflected.

It will be appreciated that the method and apparatus of this invention allows for precision thickness control capability during lapping and polishing of semiconductor wafers. It also allows for the automatic control of the lapping and polishing process and affords a precision end-point detection during chemical etching. It will also be appreciated that this method can be successfully applied to very thin diaphragms or other structures. This method and apparatus is low cost, simple, and easy to use. It is also adapted to allowing several "fuses" or monitoring points transversely positioned at various points on the rear side of the wafer.

Accordingly, the improved METHOD AND APPARATUS FOR OBTAINING A PRECISION THICKNESS IN SEMICONDUCTOR AND OTHER WAFERS is simplified, provides an effective, safe, inexpensive, and efficient device which achieves all the enumerated objectives, provides for eliminating difficulties encountered with prior devices, and solves problems and obtains new results in the art.

In the foregoing description, certain terms have been used for brevity, clearness, and understanding; but no unnecessary limitations are to be implied therefrom beyond the requirement of the prior art, because such terms are used for descriptive purposes and are intended to be broadly construed.

Moreover, the description and illustration of the invention is by way of example, and the scope of the invention is not limited to the exact details shown or described.

Having now described the features, discoveries, and principles of the invention, the manner in which the METHOD AND APPARATUS FOR OBTAINING A PRECISION THICKNESS IN SEMICONDUCTOR AND OTHER WAFERS is constructed and used, the characteristics of the construction, and the advantageous new and useful results obtained; the new and useful structures, devices, elements, arrangements, parts, combinations, and methods are set forth in the appended claims.

What is claimed is:

1. In a method for processing a wafer comprising a material selected from an electrical semiconducting material and an electrical insulating material having opposed generally planar front and rear sides and a peripheral edge, wherein said wafer is pressed against a pad in the presence of a slurry to reduce the thickness of the wafer to a desired thickness, wherein the improvement comprises the steps of:

(a) forming on the rear side of the wafer a recess having a base surface;

(b) designating spaced first and second electrical connection positions on the rear side of the wafer between the base surface of the recess and the peripheral edge of the wafer and providing a first electrical conducting means extending from the first electrical connection means to the base surface of the recess to the second electrical connection position, wherein said first electrical conducting means overlies the base surface of the recess;

(c) providing a second electrical conducting means from the first electrical conducting means directly to the second electrical conducting means to form, in combination with said first electrical conducting means, a closed electrical circuit, and causing an electrical current to flow through said closed electrical circuit; and (d) from the front side of the wafer, reducing the initial thickness of the wafer until the base surface of the recess is reached and the first conductive means is at least partially removed therefrom.

2. The method of claim 1 wherein the electrical circuit formed in step (c) is opened in step (d) to interrupt the flow of the electrical current caused in flow to step (c).

3. The method of claim 2 wherein interrupting the flow of electrical current in step (e) results in an automatic cessation of the reducing of the thickness of the wafer at the desired thickness.

4. The method of claim 3 wherein the base surface of the recess is at a perpendicular depth below the rear surface, and said perpendicular depth is about equal to the desired thickness of the wafer.

5. The method of claim 1 wherein in step (d) the electrical conducting means overlying the base surface of the recess is restricted to reduce the flow of the electrical current caused to flow in step (c).

6. The method of claim 5 wherein interrupting the flow of electrical current in step (e) results in an automatic cessation of the reducing of the thickness of the wafer at the desired thickness.

7. The method of claim 6 wherein the base surface of the recess is at a perpendicular depth below the rear surface, and said perpendicular depth is about equal to the desired thickness of the wafer.

8. The method of claim 1 wherein the recess is a dimple having a peripheral wall perpendicularly interposed between the rear side of the wafer to the base surface of the recess.

9. The method of claim 1 wherein the recess is centrally located on the rear side of the wafer, and the first and second electrical connection positions are each adjacent the peripheral edge of the wafer.

10. The method of claim 1 wherein the first conducting means is a conductive coating of the rear side of the wafer selected from the group consisting of a metalized coating, and a conductive polymer coating.

11. The method of claim 1 wherein an electrical potential source is interposed between the first and second electrical connection positions on the second electrical conducting means.

12. The method of claim 1 wherein the rear surface of the wafer is superimposed on a carrier substrate.

13. The method of claim 1 wherein in step (d) the thickness of the wafer is reduced by lapping.

14. An assembly for facilitating the fabrication of electronic components to a desired thickness comprising:

a wafer comprising a material selected from the group consisting of an electrical semiconducting material and an electrical insulating material and having opposed generally planar front and rear sides and a recess on said rear side, wherein said recess has a base surface at a depth below the rear surface of the wafer, and there are spaced first and second electrical connection positions on said rear side of the wafer;

a first electrical conducting means extending from the first electrical connection position to the base surface of the recess and then to the second electrical connection position, wherein said first electrical conducting means at least partially overlies the base surface of the recess;

an electrical potential source; and a second electrical conducting means extending from the first electrical connection position to the electrical potential source to the second electrical connection position and forming with said first electrical conducting means a closed electrical circuit.

15. The assembly of claim 14 wherein the depth of the base surface below the rear surface of the wafer is about equal to the desired thickness of the wafer.

16. The assembly of claim 14 wherein the recess is a dimple having a peripheral wall perpendicularly interposed between the rear side of the wafer to the base surface of the recess.

17. The assembly of claim 14 wherein the recess is centrally located on the rear side of the wafer, and the first and second electrical connection positions are each adjacent the peripheral edge of the wafer.

18. The assembly of claim 14 wherein the first conducting means is a conductive coating selected from the group consisting of a metalized coating, and a conductive polymer coating.

19. The assembly of claim 14 wherein an electrical potential source is interposed between the first and second electrical connection positions on the second electrical conducting means.

20. An assembly for facilitating the fabrication of electronic components to a desired thickness comprising:

a wafer comprising a material selected from the group consisting of an electrical semiconducting material and an electrical insulating material and having opposed generally planar front and rear sides and an aperture extending from the rear side to the front side of the wafer;

a first electrical conducting means extending from the first electrical connection position to the aperture and which is then interrupted at said aperture, and then extends from said aperture to the second electrical connection position;

an electrical potential source; and a second electrical conducting means extending from the first electrical connection position to the electrical potential source to the second electrical connection position and forming with said first electrical conducting means an open electrical circuit.

21. In a method for processing a wafer comprising a material selected from an electrical semiconducting material and an electrical insulating material having opposed generally planar front and rear sides and a peripheral edge, wherein said wafer is pressed against a pad in the presence of a slurry to reduce the thickness of the wafer to a desired thickness, wherein the improvement comprises the steps of:

(a) forming on the rear side of the wafer a recess having a base surface;

(b) providing an energy conducting means or an energy reflecting means on the base surface of the recess formed in step (a); and (c) from the front side of the wafer, reducing the initial thickness of the wafer until the base surface of the recess is reached and the energy conducting means or energy reflecting means is at least partially removed therefrom.

22. The method of claim 21 wherein the energy is electricity.

23. The method of claim 22 wherein the energy is light.

24. The method of claim 23 wherein a light conveying means connects a light source and a light detection means, and said light conveying means extends in superimposed relation over at least a part of the base surface of the recess.

25. The method of claim 23 wherein a light emitting means and a light receiving means are provided and a light reflecting means is superimposed over at least part of the base surface of the recess, and a light beam is directed from the light emitting means toward the light reflecting means and is then reflected in a reflected light beam to the light beam receiving means.

26. The method of claim 25 wherein the reflected light beam has an intensity and the light receiving means detects changes in said intensity of the reflected light beam.

27. The method of claim 25 as herein the reflected light beam is reflected from the light reflecting means at an angle of reflection and the light receiving means detects changes in said angle of reflection of the reflected light beam.

* * * * *